US008290028B2

(12) United States Patent
Takeuchi

(10) Patent No.: US 8,290,028 B2
(45) Date of Patent: Oct. 16, 2012

(54) INPUT/OUTPUT CIRCUIT

(75) Inventor: Masahiro Takeuchi, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 1151 days.

(21) Appl. No.: 12/155,242

(22) Filed: May 30, 2008

(65) Prior Publication Data

US 2008/0310569 A1    Dec. 18, 2008

(30) Foreign Application Priority Data

Jun. 1, 2007  (JP) ................................. 2007-146874

(51) Int. Cl.
    H04B 1/38        (2006.01)
    H04B 1/10        (2006.01)
    H04L 7/00        (2006.01)
(52) U.S. Cl. ........................................ 375/219; 375/350
(58) Field of Classification Search .................. 375/256, 375/257, 259, 219, 295, 296, 229, 230, 232, 375/233, 355, 371–376, 316, 346, 350; 329/315, 329/318, 347, 349; 332/106, 107, 117, 123, 332/149, 159; 333/18, 28 R
    See application file for complete search history.

(56) References Cited

U.S. PATENT DOCUMENTS

| 6,897,685 | B2 | 5/2005 | Sato |
| 7,187,727 | B2 | 3/2007 | Saeki |
| 7,336,754 | B2 | 2/2008 | Aoyama |
| 7,412,016 | B2 * | 8/2008 | Stojanovic .................... 375/355 |
| 2003/0007222 | A1 | 1/2003 | Kwasaki et al. |
| 2004/0252804 | A1 | 12/2004 | Aoyama |
| 2005/0226355 | A1 | 10/2005 | Kibune et al. |
| 2006/0023779 | A1 | 2/2006 | Kwak et al. |
| 2007/0080718 | A1 * | 4/2007 | Stojanovic et al. ............. 326/87 |
| 2007/0160173 | A1 | 7/2007 | Takeuchi |
| 2008/0080608 | A1 * | 4/2008 | Mobin et al. ................... 375/233 |

FOREIGN PATENT DOCUMENTS

| JP | 10-198913 | 7/1998 |
| JP | 2002-190724 | 7/2002 |
| JP | 2003-018140 A | 1/2003 |
| JP | 2005-5999 | 1/2005 |
| JP | 2005-303607 A | 10/2005 |
| JP | 3730607 | 10/2005 |
| JP | 2006-42339 | 2/2006 |
| JP | 2007-184847 | 7/2007 |

OTHER PUBLICATIONS

Japanese Office Action dated Jun. 26, 2012 with an English translation.

* cited by examiner

Primary Examiner — Tesfaldet Bocure
(74) Attorney, Agent, or Firm — McGinn IP Law Group, PLLC

(57) ABSTRACT

Disclosed is a SERDES circuit including a clock and data recovery circuit that allows operational margin in temporal and voltage directions to be measured, using a phase offset signal and a threshold voltage control signal, a pre-emphasis driver circuit and an equalizer circuit in order to reduce ISI on a transmission line, and an optimization control circuit for controlling the overall circuit. The optimization control circuit controls an equalizer control signal that is for adjusting characteristics of the equalizer circuit and a driver control signal that is for adjusting characteristics of the pre-emphasis driver circuit and sets the equalizer control signal and driver control signal so that the operational margin of the clock and data recovery circuit is maximized.

20 Claims, 7 Drawing Sheets

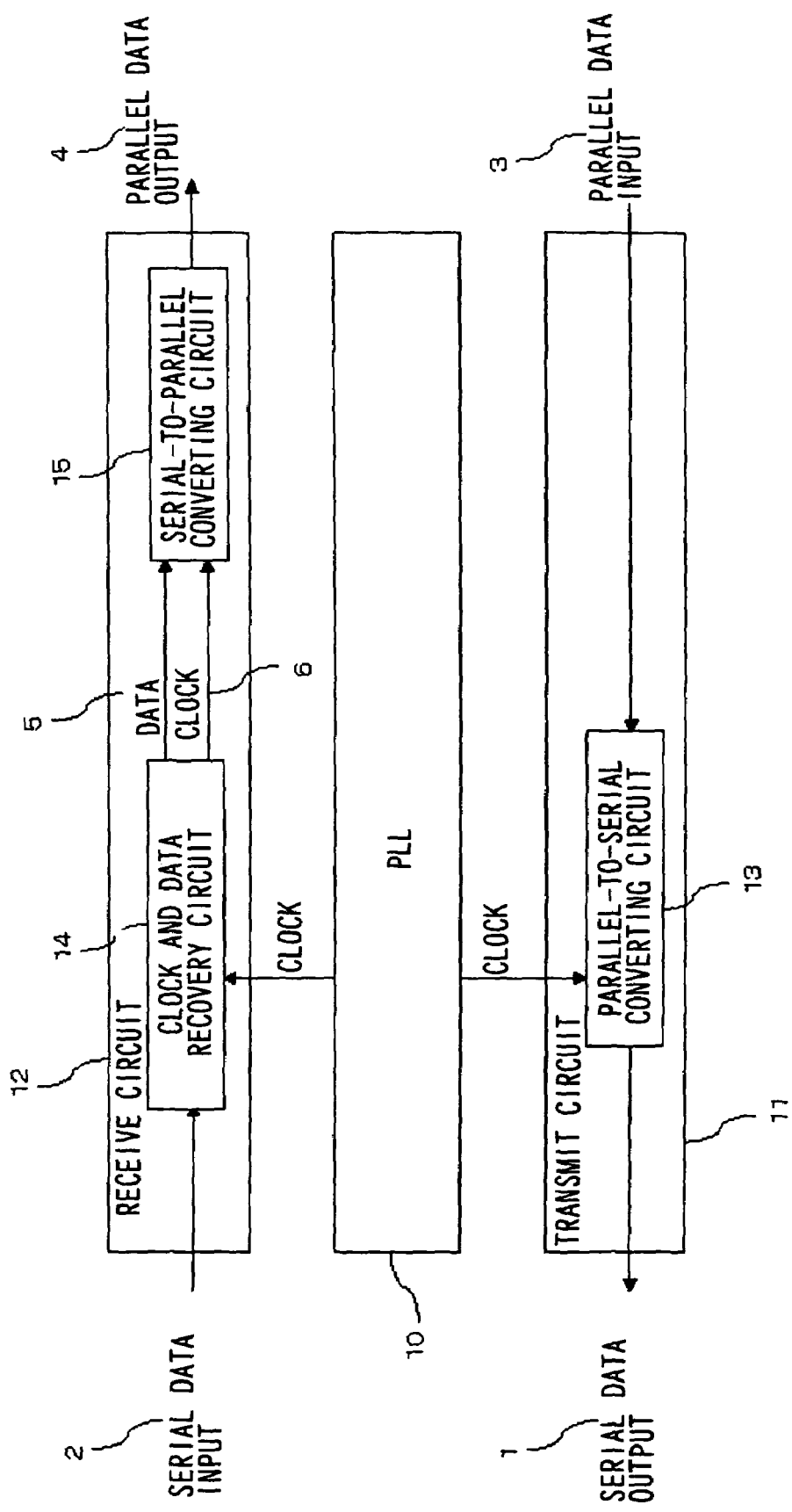

US 8,290,028 B2

INPUT/OUTPUT CIRCUIT

REFERENCE TO RELATED APPLICATION

This application is based upon and claims the benefit of the priority of Japanese patent application No. 2007-146874, filed on Jun. 1, 2007, the disclosure of which is incorporated herein in its entirety by reference thereto.

TECHNICAL FIELD

The present invention relates to an input/output circuit. More specifically, the invention relates to an input/output circuit suitable for being applied to a SERDES (SERializer and DEserializer) circuit or the like for performing high-speed serial data transmission between LSIs (Large Scale Integrated Circuits), and a semiconductor device including the input/output circuit.

BACKGROUND

With development of a semiconductor technology in recent years, high-speed serialization of data transmission between LSIs has been performed. As an interface for serializing parallel data for transmission, outputting the serialized parallel data to a transmission line, and converting received serial data into parallel data, a circuit referred to as a so-called "SER-DES" (SERializer and Deserializer) has been in wide spread used. The SERDES circuit will be described with reference to FIG. 7.

As shown in FIG. 7, the SERDES is configured by including a PLL (Phase Locked Loop) circuit that generates a clock signal which will be used inside the device, a transmit circuit 11, and a receive circuit 12.

The transmit circuit 11 includes a parallel-to-serial converting circuit 13 that serializes parallel data. The receive circuit 12 includes a clock and data recovery circuit 14 and a serial-to-parallel converting circuit 15. The clock and data recovery circuit 14 extracts from received serial data a clock synchronized with the received serial data, and outputs the extracted clock signal (recovery clock) and the data. The serial-to-parallel converting circuit 15 parallelizes the serial data. With respect to the clock and data recovery circuit, descriptions in Patent Document 1 and 2 are referred to.

Due to high speed data transmission between LSIs, degradation in a transmission line between the LSIs has become nonnegligible. The transmission line has a low-pass filter characteristic. Thus, a high frequency component of not less than a predetermined frequency is attenuated, and interference between temporally adjacent symbols (ISI: Inter Symbol Interference) is generated. Quality of an input data waveform in a receiver side LSI is therefore degraded.

In order to suppress this degradation caused by the ISI, a pre-emphasis driver circuit is used in a transmitter side LSI, and an equalizer circuit is used in the receiver side LSI.

An example of the pre-emphasis driver circuit is disclosed in Patent Document 3. An example of the equalizer circuit is disclosed in each of Patent Documents 4 and 5. The equalizer disclosed in Patent Document 5 is referred to as a "DFE" (Decision Feedback Equalizer).

[Patent Document 1]
JP Patent Kokai Publication No. JP-P2002-190724A
[Patent Document 2]
JP Patent Kokai Publication No. JP-P2005-5999A
[Patent Document 3]
JP Patent No. 3730607

[Patent Document 4]
JP Patent Kokai Publication No. JP-P2006-42339A
[Patent Document 5]
JP Patent Kokai Publication No. JP-A-10-198913

SUMMARY OF THE DISCLOSURE

The entire disclosures of Patent Documents 1 to 5 are incorporated herein by reference thereto. The following analyses are given by the present invention.

The conventional clock and data recovery circuit does not have a function of determining whether the recovery clock signal extracted from the received serial data is optimal and whether there is sufficient operational margin in a temporal direction and a voltage direction.

When the operational margin in the temporal and voltage directions of the clock and data recovery circuit is small, it is desired that this operational margin be improved to be large.

Further, the pre-emphasis driver circuit and the equalizer circuits disclosed in Patent Documents 3 through 5 may reduce degradation of a waveform caused by the ISI, and may enlarge an eye opening. However, the obtained eye opening is not always optimal for a clock and data recovery circuit that receives the waveform, for recovery. This is caused by absence of means for measuring the operational margin of the clock and data recovery circuit and the operational margin of the clock and data recovery system not always being maximized by the wide eye opening.

The present invention has been devised based on the knowledge described above, and is generally configured as follows in order to solve the problems described above.

An input/output circuit according to one aspect of the present invention includes a clock and data recovery circuit that extracts clock and data from input data and is capable of measuring operational margin in a temporal direction and in a voltage direction. The input/output circuit according to the one aspect of the present invention further includes: an optimization control circuit that performs control so that the characteristic of a pre-emphasis driver circuit that pre-emphasizes, and drives data to be output and/or the characteristic of an equalizer circuit that equalizes input data are optimized, based on a result of measurement of the operational margin of the clock and data recovery circuit.

In the present invention, a parallel-to-serial converting circuit and a selection circuit may be included. The parallel-to-serial circuit receives parallel data, converts the parallel data into serial data, and supplies the serial data to the pre-emphasis driver circuit. The selection circuit selects, as the parallel data to be supplied to the parallel-to-serial converting circuit, one of parallel data to be transmitted during a normal operation and an opposing driver control signal generated by the optimization control circuit, for controlling characteristics of a pre-emphasis driver circuit of an input/output circuit of an opposing device.

In the present invention, a serial-to-parallel data converting circuit may be further included. The serial-to-parallel data converting circuit converts serial data from the clock and data recovery circuit into parallel data. The optimization control circuit may monitor the parallel data output from the serial-to-parallel data converting circuit, and may control the pre-emphasis circuit of an own device when the opposing driver control signal for controlling the characteristics of the pre-emphasis driver circuit is received from other device.

In the present invention, the clock and data recovery circuit includes:
a data sampling circuit that receives the input data and samples the input data in response to the clock;

a phase comparator that detects a phase relationship between the clock and the data sampled by said data sampling circuit;

a phase controller that outputs a phase control signal based on a result of phase comparison by the phase comparator; and a phase interpolator that outputs a clock signal phase-interpolated based on the phase control signal. The clock signal output from the phase interpolator is supplied to the data sampling circuit, thereby forming a loop. The phase controller generates another phase control signal different from the phase control signal. In the present invention, the clock and data recovery circuit may further include:

another phase interpolator that receives the other phase control signal output from the phase controller and generates a clock signal phase-interpolated based on the other phase control signal;

a threshold voltage generator that generates a threshold voltage;

another data sampling circuit that samples the input data based on the clock signal from the other phase interpolator and the threshold voltage; and a comparison circuit that compares the data sampled by the data sampling circuit and the other data sampling circuit, respectively. Then, a result of the comparison by the comparison circuit may be supplied to the optimization control circuit as an error detection result.

In the present invention, the optimization control circuit supplies to the phase controller a phase offset signal for adding a phase offset between the phase control signal and the other phase control signal generated by the phase controller, thereby variably controlling the phase offset. The optimization control circuit supplies to the threshold voltage generator a threshold voltage control signal that controls the threshold voltage to be generated by the threshold voltage generator, thereby variably controlling the threshold voltage. Then, by checking whether the other data sampling circuit could correctly sample the data based on the error detection result from the comparison circuit, measurement of the operational margin of the clock and data recovery circuit in the temporal and voltage directions is enabled.

In the present invention, the optimization by the optimization control circuit may be executed at power-on. Alternatively, the optimization may be performed at a time of a normal data transmission operation.

The meritorious effects of the present invention are summarized as follows.

With an input/output circuit according to the present invention, the operational margin of a clock and data recovery circuit is able to be improved.

Still other features and advantages of the present invention will become readily apparent to those skilled in this art from the following detailed description in conjunction with the accompanying drawings wherein examples of the invention are shown and described, simply by way of illustration of the mode contemplated of carrying out this invention. As will be realized, the invention is capable of other and different examples, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIG. 7 is a block diagram showing a typical configuration of a SERDES circuit in a related art.

PREFERRED MODES OF THE INVENTION

Figure 1:
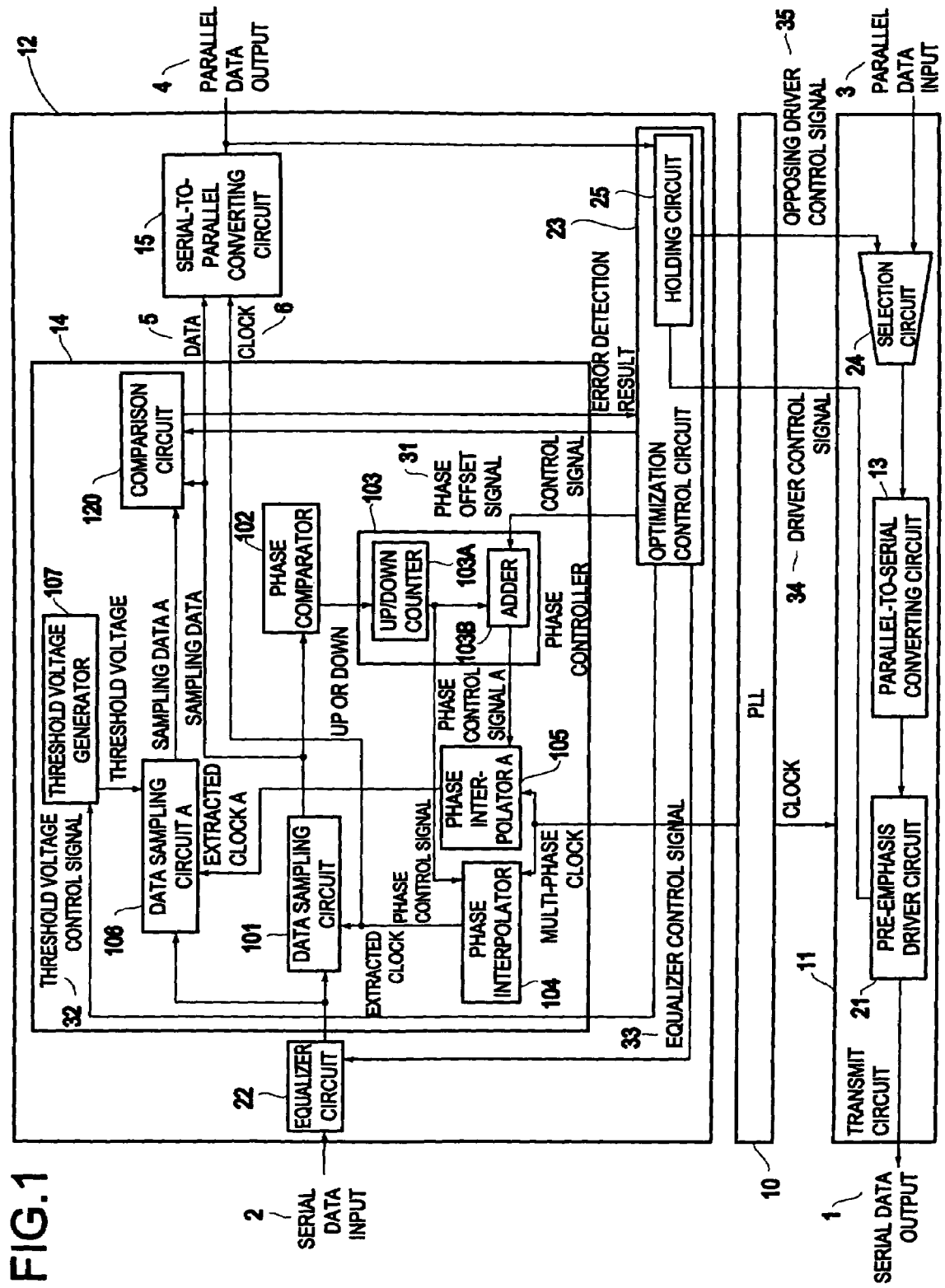
FIG. 1 is a block diagram showing a configuration of a first example of the present invention.

Preferred modes of the invention will be given with reference to appended drawings. In one aspect of the present invention, referring to FIG. 1, a receive circuit (12) includes an equalizer circuit (22), a clock and data recovery circuit (14), a serial-to-parallel converting circuit (15), and an optimization control circuit (23). The equalizer circuit (22) performs equalize processing for reducing ISI (Inter Symbol Interference) degradation in a transmission line. The clock and data recovery circuit (14) receives an output of the equalizer circuit (22). The serial-to-parallel converting circuit (15) converts serial data extracted by the clock and data recovery circuit into parallel data. The optimization control circuit (23) supplies an equalizer control signal (33) to the equalizer circuit (22), thereby controlling characteristics of the equalizer circuit (22), based on a result of measurement of operational margin of the clock and data recovery circuit (14) in a temporal direction and in a voltage direction.

In the one aspect of the present invention, referring to FIG. 1, a transmit circuit (11) includes a selection circuit (24), a parallel-to-serial converting circuit (13) that converts parallel data output from the selection circuit (24) into serial data, and a pre-emphasis driver circuit (21) for reducing the ISI degradation in the transmission line. The selection circuit (24) selects one of the parallel data to be transmitted at a time of a normal operation and an opposing driver control signal (35) that controls a pre-emphasis driver circuit mounted on an opposing device.

The optimization control circuit (23) supplies a driver control signal (34) to the pre-emphasis driver circuit (21), thereby controlling characteristics of the pre-emphasis driver circuit (21), based on the measurement result of the operational margin of the clock and data recovery circuit (14) in the temporal and voltage directions. When the receive circuit (12) receives the opposing driver control signal from the opposing device, the optimization control circuit (23) supplies the driver control signal (34) to the pre-emphasis driver circuit (21) of the transmit circuit (11) of its own to adjust each pre-emphasis TAP coefficient, thereby adjusting characteristics of the pre-emphasis driver circuit (21).

In the one aspect of the present invention, the clock and data recovery circuit (14) includes a data sampling circuit (101), a phase comparator (102), a phase controller (103), and a phase interpolator (104). The data sampling circuit (101) receives an input data signal and samples the input data signal in response to a clock. The phase comparator (102) receives the data signal sampled by the data sampling circuit (101) and detects a phase relationship between the clock signal and the data signal. The phase controller (103) outputs a phase control signal based on a result of phase comparison by the phase comparator (102). The phase interpolator (104) outputs a clock signal phase-interpolated based on the phase control signal. The clock signal output from the phase interpolator (104) is supplied to the data sampling circuit (101), thereby forming a loop. The phase controller (103) generates other phase control signal different from the phase control signal described before.

In the one aspect of the present invention, the clock and data recovery circuit (14) further includes another phase interpolator (105), a threshold voltage generator (107), another data sampling circuit (106), and a comparison circuit (120). The other phase interpolator (105) receives the other phase control signal output from the phase controller (103) and generates a clock signal phase-interpolated based on the other phase control signal. The threshold voltage generator (107) generates a threshold voltage. The other data sampling circuit (106) samples input data based on the clock signal from the other phase interpolator (105) and the threshold voltage. The comparison circuit (120) compares the sampling data sampled by the data sampling circuit (101) and the other data sampling circuit (106), respectively. A result of the comparison by the comparison circuit is supplied to the optimization control circuit (23) as an error detection result.

In the one aspect of the present invention, the optimization control circuit (23) supplies a phase offset signal (31) for adding a phase offset between the phase control signal and the other phase control signal which are generated by the phase controller (103) of the clock and data recovery circuit (14). The phase offset is thereby controlled variably.

Further, in the one aspect of the present invention, the optimization control circuit (23) supplies a threshold voltage control signal (32) that is for controlling the threshold voltage to be generated by the threshold voltage generator (107) of the clock and data recovery circuit (14). The threshold voltage is thereby controlled variably.

The clock and data recovery circuit (14) can vary the phase of a clock output from the other phase interpolator (105) according to the phase offset signal (31) output from the optimization control circuit (23) and can vary the threshold voltage output from the threshold voltage generator (107) according to the threshold voltage control signal (32), while performing a recovery operation of the received serial data signal.

By specifying the phase offset signal (31) and the threshold voltage control signal (32) and checking the comparison result (error detection result) of the comparison circuit (120) by the optimization control circuit (23), it is determined that there is the operational margin corresponding to the current phase offset signal (31) and the current threshold voltage control signal (32), when result of the comparison circuit (120) indicates a match.

When the result of the comparison by the comparison circuit (120) does not indicates the match, the optimization control circuit (23) determines there is no operational margin corresponding to the current phase offset signal (31) and the threshold voltage control signal (32).

As described above, by checking for various combinations of the phase offset signal (31) and the threshold voltage control signal (32) whether the other data sampling circuit (106) could sample data correctly based on the error detection result from the comparison circuit (120) of the clock and data recovery circuit (14), the operational margin in the temporal and voltage directions of the clock and data recovery circuit can be measured.

In the one aspect of the present invention, the optimization control circuit (23) generates at least one or all of:

the phase offset signal (31) to be supplied to the phase controller (103) of the clock and data recovery circuit (14);

the threshold voltage control signal (32) to be supplied to the threshold voltage generator (107) of the clock and data recovery circuit (14);

the driver control signal to be supplied to the pre-emphasis driver circuit (21) of the transmit circuit (11);

the equalizer control signal (33) that controls the equalizer circuit (22) of the receive circuit (12); and the opposing driver control signal (35) to be supplied to the selection circuit (24) of the transmit circuit (11).

In the SERDES circuit of the present invention, the optimization control circuit (23) on a receiving side generates the opposing driver control signal for an opposing LSI (an LSI on a transmitting side) and supplies the opposing driver control signal to the parallel-to-serial converting circuit (13). The pre-emphasis control signal can be thereby sent to the opposing LSI from the transmit circuit (11) of its own.

In the opposing LSI, the opposing driver control signal is output from the serial-to-parallel converting circuit (15). The optimization control circuit (23) extracts the opposing driver control signal and holds the opposing driver control signal in a holding circuit (25). The opposing LSI uses the opposing driver control signal to control the pre-emphasis driver of its own as the driver control signal (34).

With this arrangement, when the pre-emphasis driver in the opposing LSI is set to a specific value, the operational margin of the clock and data recovery circuit in the LSI on the receiving side in the temporal and voltage directions can be measured. By measuring the operational margin of the clock and data recovery circuit in the temporal and voltage directions with respect to various settings of the driver control signal, a set value of the driver control signal that maximizes the operational margin of the clock and data recovery circuit can be determined.

It is noteworthy herein that, in the present invention, an object to be measured is the operational margin of the clock and data recovery circuit (14) within the receive circuit (12) in the temporal and voltage directions, rather than an eye opening. For this reason, according to the present invention, a set value of the equalizer control signal (33) and the set value of the driver control signal (34) that preferably maximize the operational margin of the clock and data recovery circuit (14) can be obtained. A detailed description will be given below in connection with specific examples.

EXAMPLES

FIG. 1 is a diagram showing an overall configuration of a SERDES circuit according to a first example of the present invention. Referring to FIG. 1, in the clock and data recovery circuit 14, the data sampling circuit 101, phase comparator 102, phase controller 103, and phase interpolator 104 form a loop. The data sampling circuit 101 samples input data in response to the extracted clock. The phase comparator 102 receives the data sampled by the data sampling circuit 101 and detects the phase relationship between the clock and the data based on the data. The phase controller 103 outputs the phase control signal based on the result of phase comparison (UP/DOWN) output from the phase comparator 102. The phase interpolator 104 receives a multi-phase clock composed of a plurality of clock signals, and supplies to the data sampling circuit 101, as the extracted clock, the clock that has been phase-interpolated based on the phase control signal output from the phase controller 103.

Further, the phase controller 103 generates the other phase control signal (a phase control signal A) different from the phase control signal, and supplies the other phase control signal (phase control signal A) to the other phase interpolator A 105. The other phase interpolator A 105 receives the multi-phase clock in common with the phase interpolator 104, and outputs the clock signal interpolated corresponding to the other phase control signal (phase control signal A) as other extracted clock (an extracted clock A).

The SERDES circuit further includes the other data sampling circuit A 106. The other data sampling circuit A 106 samples the input data based on the other extracted clock (extracted clock A) from the other phase interpolator A 105 and the threshold voltage generated by the threshold voltage generator 107 according to the threshold voltage control signal 32.

In this data sampling circuit A 106, the phase of the clock for sampling data and a threshold level can be varied.

The SERDES circuit further includes the comparison circuit 120 that compares the data output from the two data sampling circuits 101 and 106.

A result of the comparison from the comparison circuit 120 is output as an error detection signal.

The phase controller 103 in the present example includes an up/down counter 103A that counts up or down based on the comparison result from the phase comparator 102 and an adder 103B that adds a phase offset signal 31 to an output of the up/down counter 103A.

The configuration of the clock and data recovery circuit 14 is comparable to that disclosed in the prior application (JP Patent Application No. JP2006-002692, now published as JP Patent Kokai Publication No. JP-P2007-184847A) made by the inventor of the present invention. Details of the clock and data recovery circuit 14 are referred to the prior application.

The SERDES circuit includes a PLL circuit 10 that generates an internal clock signal, the transmit circuit 11 that converts parallel data into serial data and outputs the serial data, and the receive circuit 12 that converts serial data into parallel data.

The transmit circuit 11 includes the selection circuit 24 that selects one of an input of the parallel data 3 and the opposing driver control signal 35, parallel-to-serial converting circuit 13 that receives data selected by the selection circuit 24 and converts the data into serial data, and pre-emphasis driver circuit 21 that receives the serial data converted by the parallel-to-serial converting circuit 13, and performs waveform emphasis before the pre-emphasis driver circuit 21 transmits the serial data onto the transmission line in order to reduce the ISI degradation of the transmission line.

The pre-emphasis driver circuit 21 may be a two TAP pre-emphasis driver that performs weighting of a signal that has passed through two signal paths, for addition, as disclosed in Patent Document 3, for example. The pre-emphasis driver circuit 21 may be a pre-emphasis driver of three TAPs or more. Each TAP coefficient of the pre-emphasis driver circuit 21 is variably controlled by the driver control signal 34 supplied from the optimization control circuit 23.

The receive circuit 12 includes the equalizer circuit 22, the clock and data recovery circuit 14, serial-to-parallel converting circuit 15, and optimization control circuit 23. The equalizer circuit 22 performs waveform shaping in order to reduce the ISI degradation in the transmission line. The clock and data recovery circuit 14 performs recovery from the serial data that has been shaped by the equalizer circuit 22. The serial-to-parallel converting circuit 15 converts serial data output from the clock and data recovery circuit 14 into the parallel data.

The equalizer circuit 22 may be an equalizer capable of changing characteristics by digital control, as disclosed in Patent Document 4, for example. Alternatively, the equalizer circuit 22 may be formed of a DFE having a plurality of TAP coefficients, as disclosed in Patent Document 5, for example.

The optimization control circuit 23 generates the equalizer control signal 33 that controls the characteristics or the TAP coefficients of the equalizer circuit 22, phase offset signal 31, threshold voltage control signal 32, and opposing driver control signal 35.

The optimization control circuit 23 monitors a parallel data output 4 from the receive circuit 12. When the optimization control circuit 23 receives the opposing driver control signal 35 from the transmit circuit 11 from the opposing LSI, the optimization control circuit 23 holds the opposing driver control signal 35 in the internal holding circuit 25, and also outputs the opposing driver control signal 35 as the driver control signal 34 for the pre-emphasis driver circuit 21 of its own LSI.

Further, the optimization control circuit 23 receives a comparison result signal (indicating the error detection result) output from the comparison circuit 120, and performs monitoring or observation.

Next, an operation of the SERDES circuit in this example will be described. First, an operation of the clock and data recovery circuit 14 will be described.

Figure 2A:
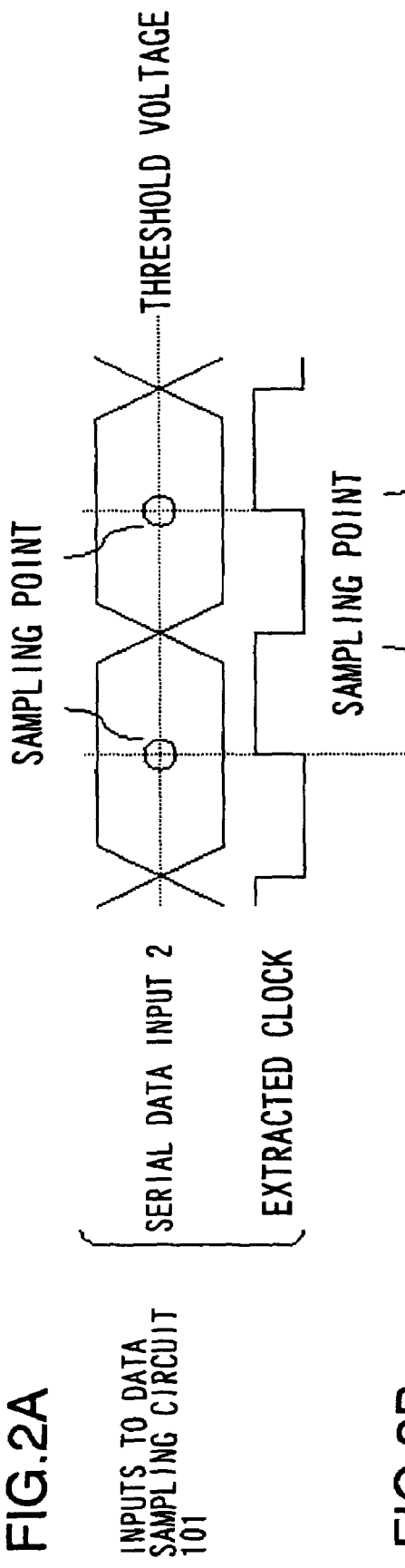
FIGS. 2A and 2B are diagrams explaining an operation of a data sampling circuit in the first example of the present invention.

Recovery is performed by the loop formed of the data sampling circuit 101, phase comparator 102, phase controller 103, and phase interpolator 104. With respect to a phase relationship between a serial data input 2 and the extracted clock input to the data sampling circuit 101, the data sampling circuit 101 samples a point in the center of a data eye, as shown in FIG. 2A (when jitter of the serial data input 2 is small and a precise data waveform is input).

Figure 2B:
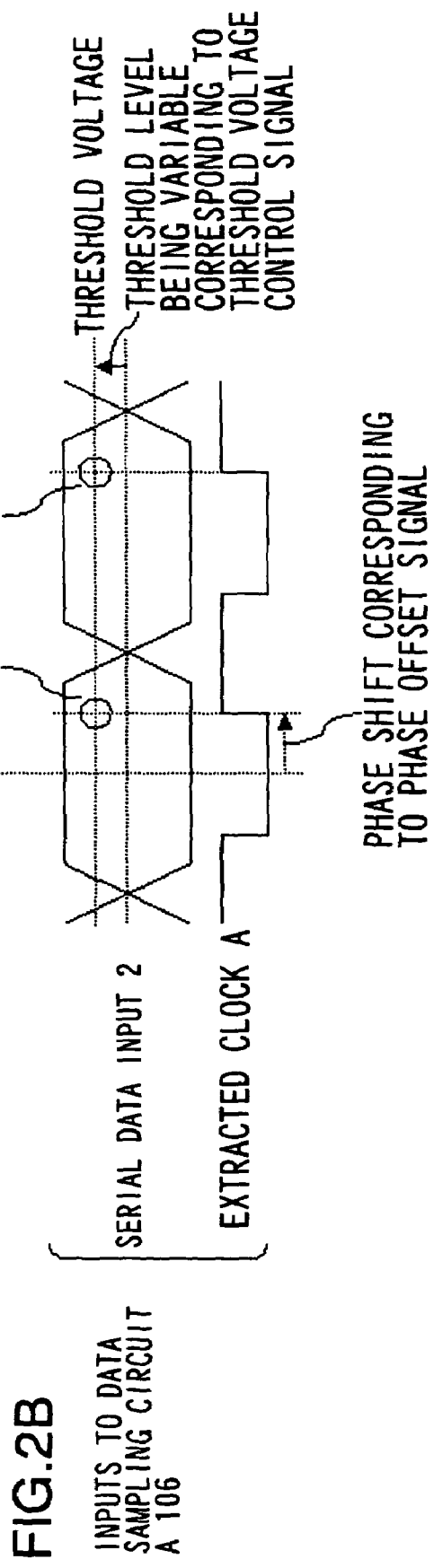

On the other hand, the data sampling circuit A 106 samples a point shifted in the temporal direction by an amount corresponding to the phase offset signal 31 and shifted in the voltage direction by an amount corresponding to the threshold voltage control signal 32, as shown in FIG. 2B.

In order to detect an error from sampling data A sampled by the data sampling circuit A 106, comparison with sampling data sampled by the data sampling circuit 101 is made by the comparison circuit 120. When both of the sampling data match with each other, it means that sampling within the same data eye is performed, as shown in FIGS. 2A and 2B. Thus, it is decided that there is an operational margin in correspondence with the phase offset signal 31 and the threshold voltage control signal 32.

When both of the sampling data do not match with each other as a result of the comparison by the comparison circuit 120, it is decided that the operational margin in correspondence with the phase offset signal 31 and the threshold voltage control signal 32 is not present.

This decision made by the optimization control circuit 23 that observes the comparison result of the comparison circuit 120 (indicated by the error detection signal).

Next, an overall operation of the SERDES circuit in this example will be described.

The operation of the SERDES circuit which will be described below is classified into two types which are optimization of the pre-emphasis driver circuit 21 and optimization of the equalizer circuit 22.

<Optimization of Equalizer Circuit>

First, an optimizing operation of the equalizer circuit 22 will be described. The optimization control circuit 23 sets the equalizer control signal 33 to a specific value, and measures the operational margin of the clock and data recovery circuit 14, using the phase offset signal 31 and the threshold voltage control signal 32.

Next, the optimization control circuit 23 sets the equalizer control signal 33 to a different value, and then measures the operational margin of the clock and data recovery circuit 14 again.

By repeating this operation and measuring the operational margins of the clock and data recovery circuit 14 with respect to all values of the equalizer control signal 33, a set value of the equalizer control signal 33 that maximizes the operational margin can be determined.

Though the description was directed to the example where the operational margin of the clock and data recovery circuit 14 is measured with respect to all the values of the equalizer control signal 33, an approach which will be described below may also be employed.

First, attention is focused on a certain TAP coefficient of the equalizer circuit 22. Only that TAP coefficient is set to be variable, and other TAP coefficients are set to be fixed. Then, operational margins of the clock and data recovery circuit 14 are measured in both cases where that TAP coefficient has been slightly increased and has been slightly decreased. A TAP coefficient updating direction for increasing the operational margin of the clock and data recovery circuit 14 is thereby determined, and the TAP coefficient is updated in that direction.

This operation is performed on all the TAP coefficients of the equalizer circuit 22.

Then, the operation is returned again to updating of the TAP coefficient of the equalizer circuit 22 that has been updated first. Then, updating of all the TAP coefficients of the equalizer circuit 22 is performed again.

By repeating this operation thereafter, the set value of the equalizer control signal 33 that maximizes the operational margin of the clock and data recovery circuit 14 may be gradually determined.

In the example described above, the description was directed to the example where the DFE is assumed as the equalizer circuit 22 and TAP coefficient optimization is performed. A parameter to be optimized differs, depending on the configuration of the equalizer.

<Optimization of Pre-emphasis Driver Circuit>

Figure 3:
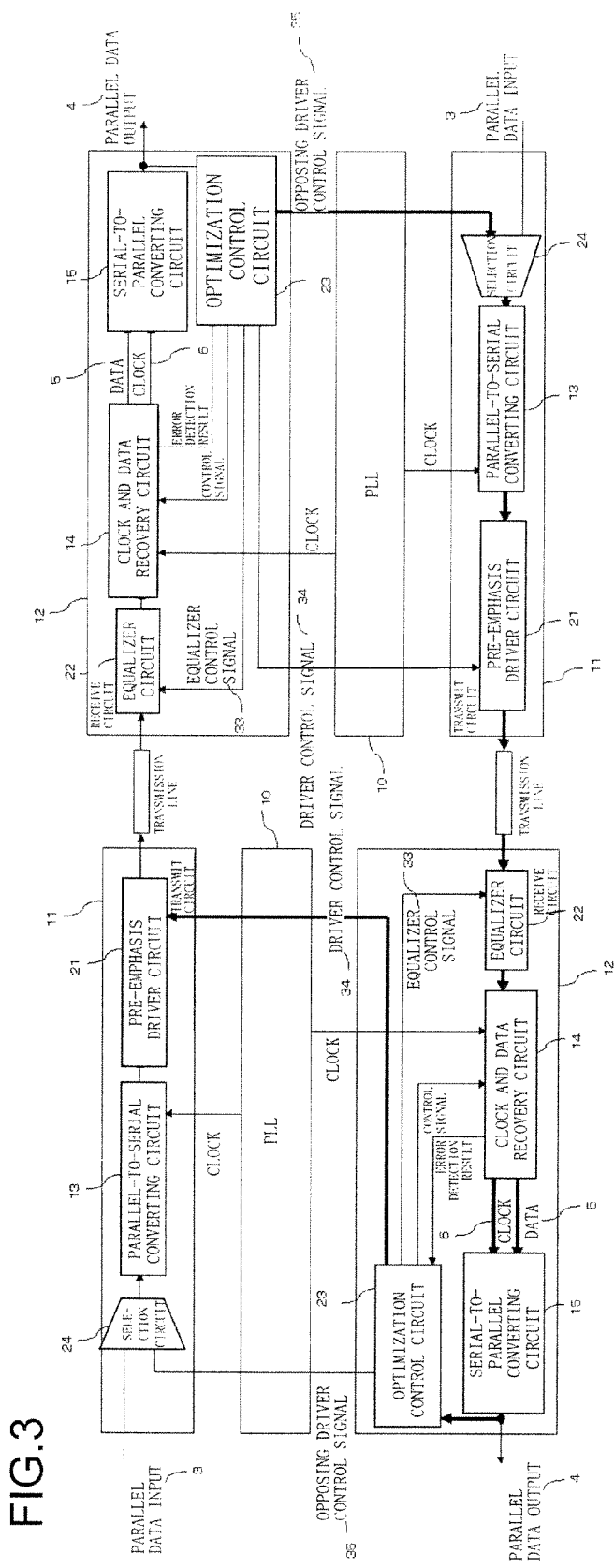
FIG. 3 is a diagram explaining an operation of the first example of the present invention.

Next, an optimizing operation of the pre-emphasis driver circuit 21 will be described using FIG. 3. FIG. 3 shows a configuration where two of the SERDES circuits are arranged side by side, which shows a state where the respective SERDES circuits are mounted on different LSIs and communication is performed through transmission lines.

A description will be given below about a case where the operational margin of the clock and data recovery circuit 14 in the SERDES circuit on the right side in the page of FIG. 3 is maximized by controlling the pre-emphasis driver circuit 21 in the SERDES circuit on the left side in the page of FIG. 3.

The optimization control circuit 23 of the SERDES circuit on the right side generates the opposing driver control signal 35. Then, the selection circuit 24 selects the opposing driver control signal 35 and transmits the opposing driver control signal 35 to the opposing LSI.

On the opposing LSI on the left side, the SERDES circuit monitors the parallel data output 4. When the SERDES circuit on the opposing LSI has received the opposing driver control signal 35, the SERDES circuit captures the opposing driver control signal 35 inside the optimization control circuit 23 and controls the pre-emphasis driver circuit 21 (operations described so far correspond to paths indicated by bold lines in FIG. 3).

The SERDES circuit on the right side measures the operational margin of the clock and data recovery circuit 14, using the phase offset signal 31 and the threshold voltage control signal 32. By repeating this operation and measuring the operational margins of the clock and data recovery circuit 14 with respect to all values of the opposing driver control signal 35, the opposing driver control signal 35 that maximizes the operational margin can be determined.

While the description was directed to the case where the operational margins of the clock and data recovery circuit 14 with respect to all the values of the opposing driver control signal 35 were measured, a method that will be described below may also be employed.

First, attention is focused on a certain TAP coefficient, and only that TAP coefficient is set to be variable, and other TAP coefficient are set to be fixed. The operational margins of the clock and data recovery circuit 14 are measured in both cases wherein the TAP coefficient is slightly increased and wherein the TAP coefficient is slightly decreased. A TAP coefficient updating direction for increasing the operational margin of the clock and data recovery circuit 14 is thereby determined. Then, updating is performed in that direction. This operation is performed on all of the TAP coefficients.

Then, the operation is returned again to updating of the TAP coefficient that has been updated first, and the TAP coefficient is updated again. By repeating this operation thereafter, a set value of the opposing driver control signal 35 that maximizes the operational margin of the clock and data recovery circuit 14 may be gradually determined.

The description was directed to optimization of the equalizer control signal 33 and optimization of the opposing driver control signal 35. After the optimization of one of the equalizer control signal 33 and the opposing driver control signal 35 is performed, the optimization of the other of the equalizer control signal 33 and the opposing driver control signal 35 may be performed. Alternatively, the optimization of both of the equalizer control signal 33 and the opposing driver control signal 35 may be simultaneously performed.

The optimization control circuit 23 measures the operational margin of the clock and data recovery circuit 14 in the temporal and voltage directions, using the phase offset signal 31 and the threshold voltage control signal 32. The operational margin in one of the temporal direction and the voltage direction may be measured and optimized. In that case, the clock and data recovery circuit 14 may be so configured that the operational margin only in the one of the temporal direction and the voltage direction can be measured.

Optimization of the equalizer control signal 33 and optimization of the opposing driver control signal 35 may be performed at each time of power-on.

Alternatively, set values of the equalizer control signal 33 and the opposing driver control signal 35 obtained at the first time of power-on may be stored in a non-volatile memory. Then, the set values may be used at the subsequent times of power-on.

Alternatively, the equalizer control signal 33 and the opposing driver control signal 35 may be optimized during a normal data transmitting operation as well as at the time of power-on. By doing so, data transmission can be performed in a state where the equalizer control signal 33 and the opposing driver control signal 35 are always set optimally, even if characteristics of the transmission line, pre-emphasis driver circuit 21, and equalizer circuit 22 are changed every moment.

Figure 4:
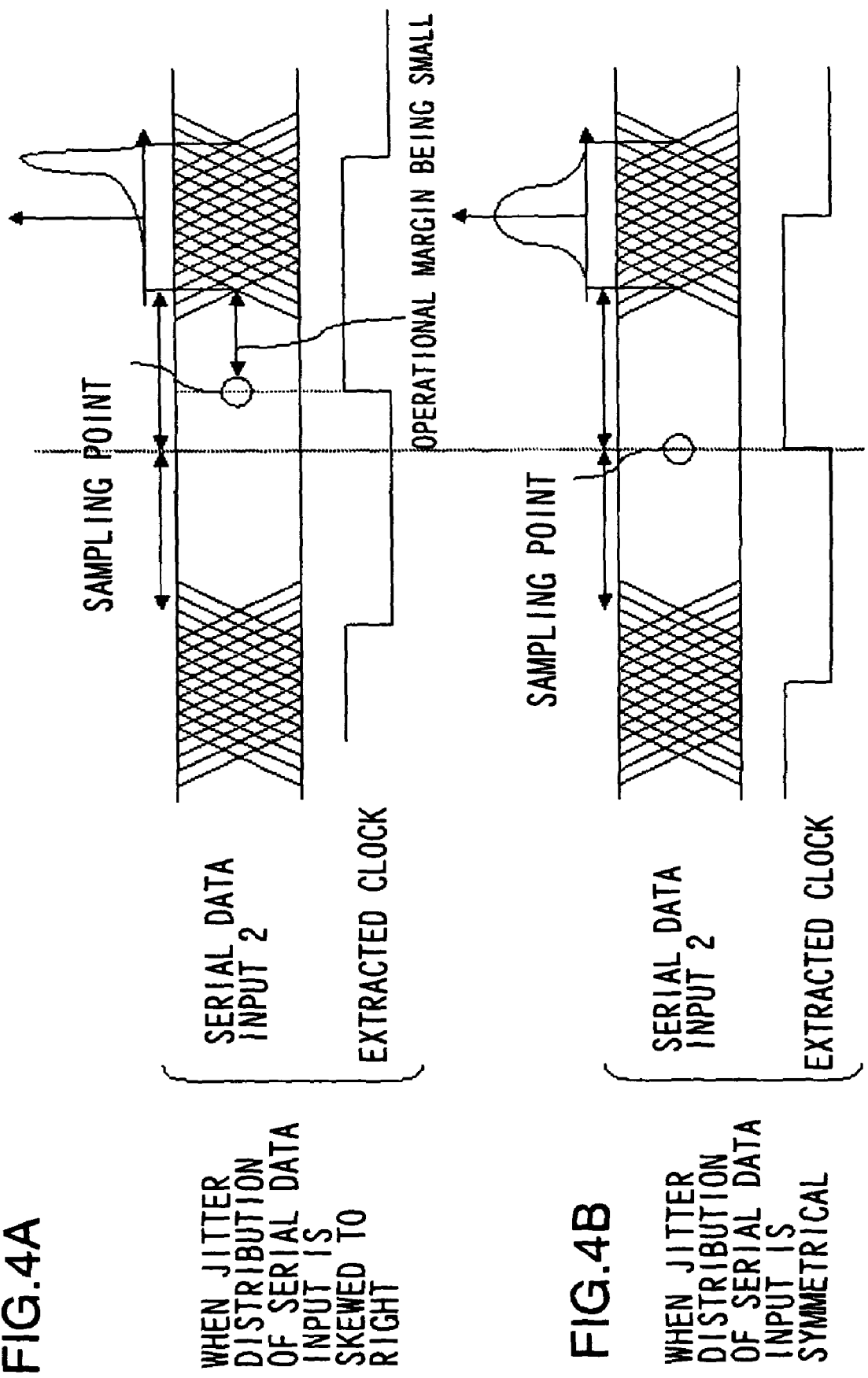
FIGS. 4A and 4B are diagrams explaining an operation of the first example.

An eye opening and the operational margin of the clock and data recovery circuit 14 will be described using FIGS. 4A and 4B. FIGS. 4A and 4B show examples where jitter distributions of serial data inputs are different, though sizes of eye openings are the same.

In an example in FIG. 4A, a jitter distribution is skewed to the right. In an example in FIG. 4B, a jitter distribution is symmetrical. In the case of the example in FIG. 4A, the phase of the extracted clock of the clock and data recovery circuit 14 tends to deviate to the right as in the jitter distribution, showing that an operational margin is small.

On the other hand, in the example in FIG. 4B, the phase of the extracted clock of the clock and data recovery circuit 14 is such that the extracted clock is substantially in the middle of a data eye, showing that sampling is performed at a point where the operational margin is large and optimal.

As described above, even if the sizes of the eye openings are the same, the operational margins of the clock and data recovery circuit 14 do not always match.

In the SERDES circuit of the present invention, the operational margin of the clock and data recovery circuit 14 is measured and optimized. Thus, the set values of the equalizer control signal 33 and the driver control signal 34 that maximize the operational margin of the clock and data recovery circuit 14 can be obtained.

Figure 5:
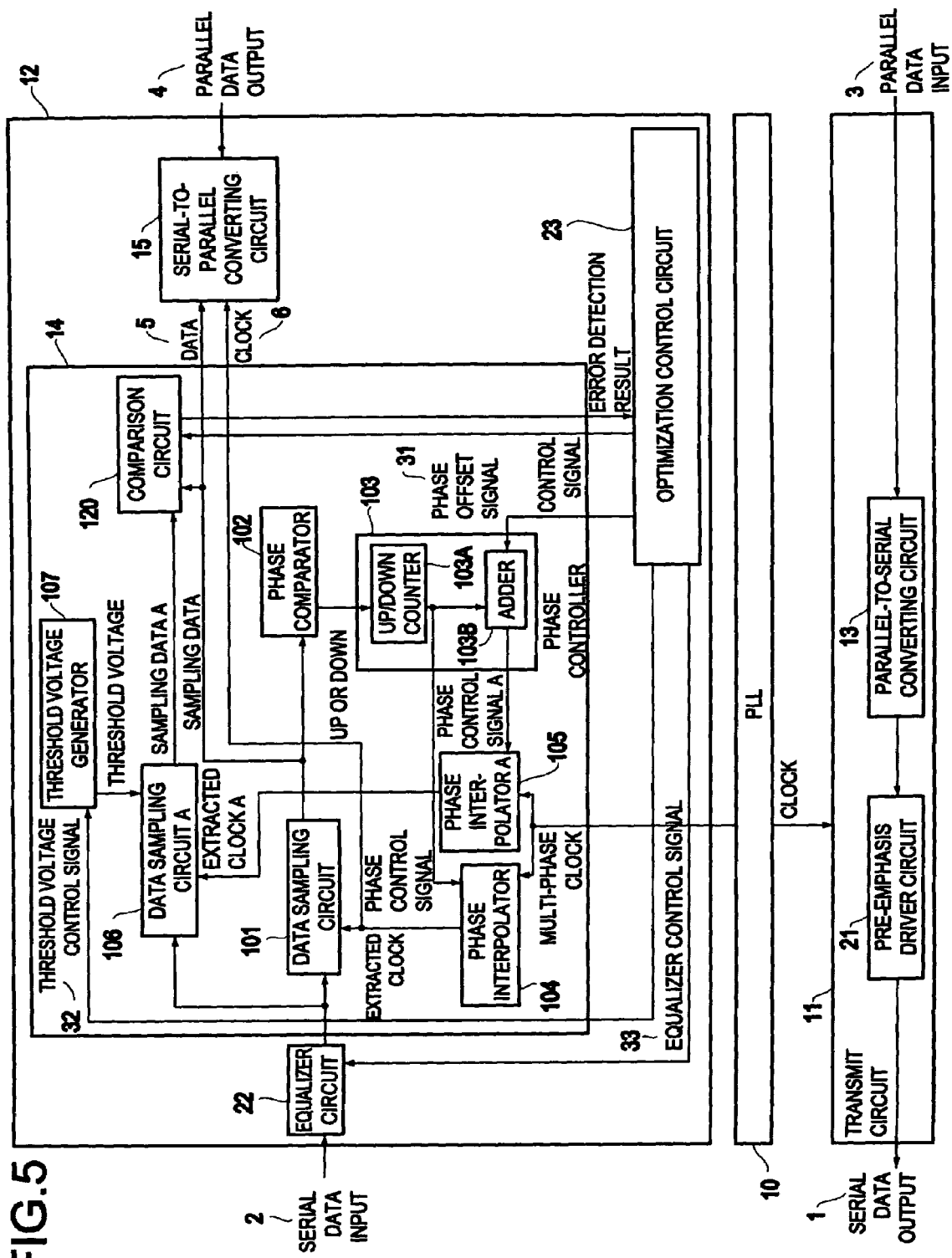
FIG. 5 is a block diagram showing a configuration of a SERDES circuit in a second example of the present invention.

FIG. 5 is a block diagram showing an overall configuration of a SERDES circuit according to a second example of the present invention. The first example is configured so that both of the pre-emphasis driver circuit 21 and the equalizer circuit 22 may be optimized. Referring to FIG. 5, the pre-emphasis driver circuit 21 is fixed at a predetermined set value, and optimization is limited to the equalizer circuit 22 alone. Except that the control signal for the pre-emphasis driver circuit 21 cannot be changed, the SERDES circuit has the same configuration as that shown in FIG. 1.

Figure 6:
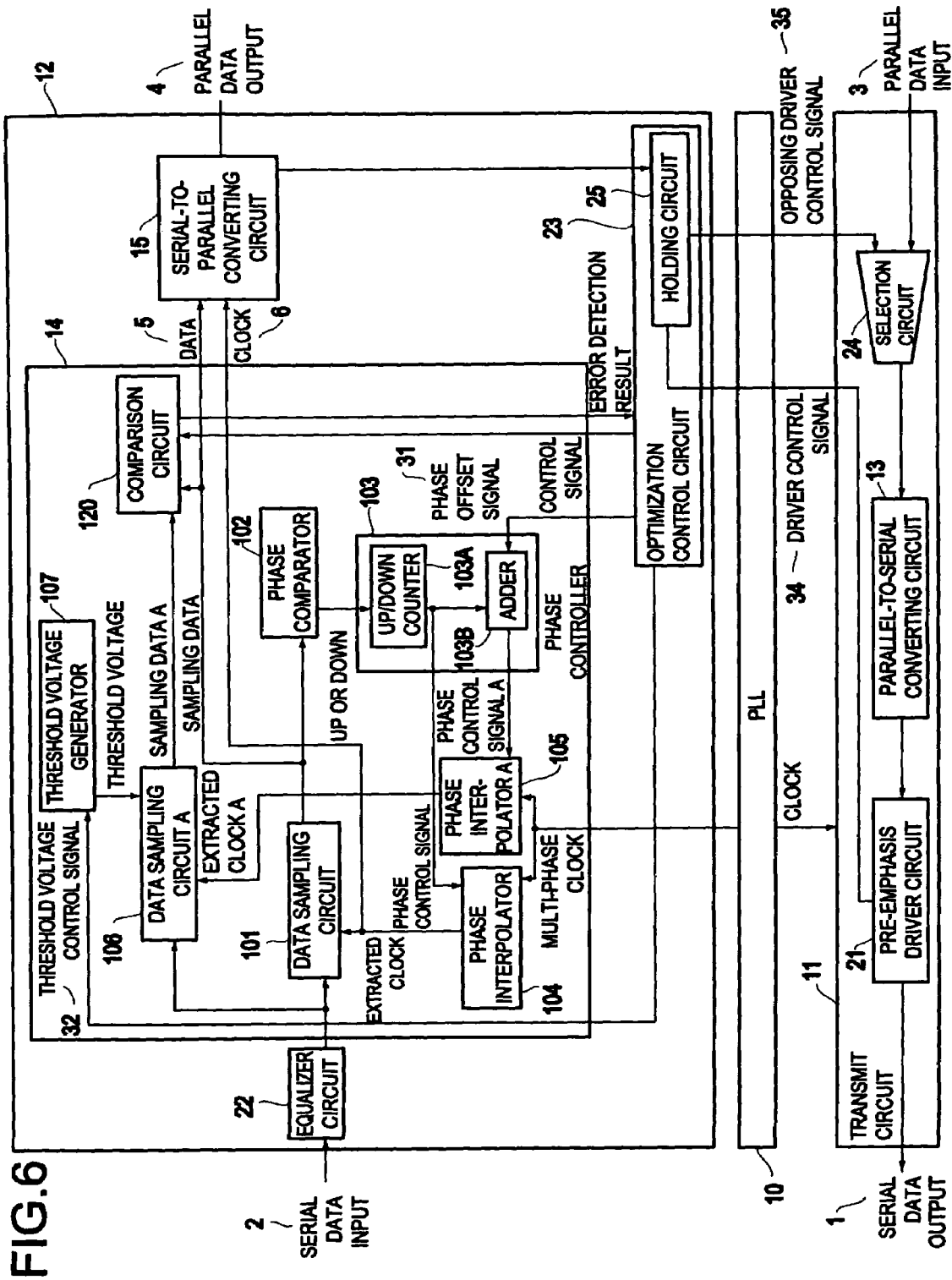
FIG. 6 is a block diagram showing a configuration of a SERDES circuit in a third example of the present invention.

FIG. 6 is a block diagram showing an overall configuration of a SERDES circuit according to a third example of the present invention. The first example is so configured that both of the pre-emphasis driver circuit 21 and the equalizer circuit 22 may be optimized. Referring to FIG. 6, the equalizer circuit 22 is fixed at a predetermined set value, and optimization is limited to the pre-emphasis driver circuit 21 alone. Except that the control signal for the equalizer circuit 22 cannot be changed, the SERDES circuit has the same configuration as that shown in FIG. 1.

Each disclosure of Patent Documents and the like described above is herein incorporated by reference. Within the scope of the entire disclosure of the present invention (including claims), and further, based on the basic technical concept of the present invention, modification and adjustment of the examples are possible. Various combinations or selections of various disclosed elements are possible within the scope of the claims of the present invention. In other words, the present invention of course includes various variations and modifications that could be made by those skilled in the art according to the entire disclosure including the claims and the technical concept.

What is claimed is:

1. An input/output circuit comprising:
a clock and data recovery circuit that extracts clock and data from input data, said clock and data recovery circuit capable of measuring an operational margin thereof in a temporal direction and in a voltage direction; and
an optimization control circuit that performs a control so that at least one of a characteristic of a pre-emphasis driver circuit that pre-emphasizes and drives output data and a characteristic of an equalizer circuit that equalizes the input data, are optimized, based on a measurement result of the operational margin of said clock and data recovery circuit.

2. The input/output circuit according to claim 1, comprising:
a transmit circuit including said pre-emphasis driver circuit; and
a receive circuit including:
said equalizer circuit;
said clock and data recovery circuit receiving the input data equalized by said equalizer circuit; and
said optimization control circuit,
wherein said optimization control circuit performs said optimization of the characteristics of said pre-emphasis driver circuit and said equalizer circuit, based on the measurement result of the operational margin of said clock and data recovery circuit.

3. The input/output circuit according to claim 1, comprising:
a transmit circuit including said pre-emphasis driver circuit; and
a receive circuit including said clock and data recovery circuit and said optimization control circuit,
wherein said optimization control circuit performs said optimization of the characteristic of said pre-emphasis driver circuit, based on the measurement result of the operational margin of said clock and data recovery circuit.

4. The input/output circuit according to claim 1, comprising a receive circuit including:
said equalizer circuit;
said clock and data recovery circuit receiving the input data equalized by said equalizer circuit; and
said optimization control circuit,
wherein said optimization control circuit performs said optimization of the characteristic of said equalizer circuit, based on the measurement result of the operational margin of said clock and data recovery circuit.

5. The input/output circuit according to claim 1, comprising:
a parallel-to-serial converting circuit that receives parallel data, converts the parallel data into serial data, and supplies the serial data to said pre-emphasis driver circuit; and
a selection circuit that selects, as the parallel data supplied to said parallel-to-serial converting circuit, either one of parallel data to be transmitted during a normal operation and an opposing driver control signal for controlling a characteristic of a pre-emphasis driver circuit provided in an input/output circuit of an opposing device, said opposing driver control signal being generated by said optimization control circuit.

6. The input/output circuit according to claim 5, comprising:
a serial-to-parallel data converting circuit that converts serial data output from said clock and data recovery circuit into parallel data,
wherein said optimization control circuit monitors the parallel data output from said serial-to-parallel data converting circuit and controls said pre-emphasis circuit of an own device when the opposing driver control signal is received.

7. The input/output circuit according to claim 1, wherein said clock and data recovery circuit comprises:
a data sampling circuit that samples the input data responsive to a clock signal;
a phase comparator that receives the input data sampled by said data sampling circuit and detects a phase relationship between the clock and the sampled input data;

a phase controller that outputs a phase control signal based on a result of a phase comparison by said phase comparator; and
a phase interpolator that generates a clock signal having a phase interpolated based on the phase control signal,
the clock signal from said phase interpolator being supplied to said data sampling circuit, thereby forming a loop,
said phase controller generating another phase control signal different from the phase control signal,
said clock and data recovery circuit further comprising:
another phase interpolator that receives said another phase control signal output from said phase controller and generates another clock signal phase-interpolated based on said another phase control signal;
a threshold voltage generator that generates a threshold voltage;
another data sampling circuit that samples the input data responsive to said another clock signal from said another phase interpolator and the threshold voltage; and
a comparison circuit that compares the data sampled by said data sampling circuit and the data sampled by said another data sampling circuit,
a result of the comparison by said comparison circuit being supplied to said optimization control circuit as an error detection result.

8. The input/output circuit according to claim 7, wherein:
said optimization control circuit supplies to said phase controller a phase offset signal for adding a phase offset between the phase control signal and the other phase control signal generated by said phase controller, thereby variably controlling the phase offset,
said optimization control circuit supplies to said threshold voltage generator a threshold voltage control signal that controls the threshold voltage to be generated by said threshold voltage generator, thereby variably controlling the threshold voltage, and
the measurement of the operational margin of said clock and data recovery circuit in the temporal and voltage directions is carried out by checking whether said another data sampling circuit could correctly sample the data based on the error detection result from said comparison circuit.

9. The input/output circuit according to claim 1, wherein the optimization by said optimization control circuit is executed at power-on.

10. The input/output circuit according to claim 1, wherein the optimization by said optimization control circuit is executed at a first time of the power-on, a result of the optimization is stored in a non-volatile storage device, and the result stored in said storage device is used at subsequent times of the power on.

11. The input/output circuit according to claim 1, wherein:
the optimization by said optimization control circuit is performed at a time of a normal data transmitting operation as well, and
data transmission is performed with the characteristics of at least one of said pre-emphasis driver circuit and said equalizer circuit kept to be optimal with respect to a change in the characteristics of said at least one of said pre-emphasis driver circuit and said equalizer circuit.

12. An interface circuit that converts parallel data, for serial transmission and converts received serially transmitted data into parallel data, including:
the input/output circuit as set forth in claim 1.

13. A semiconductor device including the input/output circuit as set forth in claim 1.

14. A clock and data recovery circuit for a SERDES (SERializer and DESerializer) circuit, said clock and data recovery circuit comprising:
a first data sampling circuit that samples input data;
a phase comparator that receives the input data sampled by said data sampling circuit and detects a phase relationship between a clock signal and the sampled input data;
a phase controller that outputs a phase control signal based on a result of a phase comparison by said phase comparator;
a first phase interpolator that generates a second clock signal having a phase interpolated based on the phase control signal, the clock signal from said phase interpolator being supplied to said data sampling circuit, thereby forming a loop, said phase controller generating a second phase control signal different from the first phase control signal,
a second phase interpolator that receives said second phase control signal output from said phase controller and generates a second clock signal, phase-interpolated based on said second phase control signal;
a threshold voltage generator that generates a threshold voltage;
a second data sampling circuit that samples the input data responsive to said second clock signal from said second phase interpolator and the threshold voltage; and
a comparison circuit that compares the data sampled by said data sampling circuit and the data sampled by said second data sampling circuit, a result of the comparison by said comparison circuit being supplied to an optimization control circuit as an error detection result,
said optimization control circuit performing a control so that at least one of a characteristic of a pre-emphasis driver circuit that pre-emphasizes and drives output data and a characteristic of an equalizer circuit that equalizes the input data, are optimized, as based on the error detection result of said clock and data recovery circuit.

15. The clock and data recovery circuit according to claim 14, wherein:
said optimization control circuit supplies to said phase controller a phase offset signal for adding a phase offset between the first phase control signal and the second phase control signal generated by said phase controller, thereby variably controlling the phase offset,
said optimization control circuit supplies to a threshold voltage generator a threshold voltage control signal that controls a threshold voltage to be generated by said threshold voltage generator, thereby variably controlling the threshold voltage, and
a measurement of an operational margin of said clock and data recovery circuit in a temporal direction and a voltage direction is carried out by checking whether said second data sampling circuit correctly samples the data based on the error detection result from said comparison circuit, given the phase offset due to the phase offset signal and the threshold voltage due to the threshold voltage generator.

16. A method of optimizing a characteristic of at least one of a pre-emphasis driver circuit that pre-emphasizes and drives output data from an input/output circuit and an equalizer circuit that equalizes input data to the input/output circuit, said method comprising:
measuring an operational margin in a temporal direction and in a voltage direction for said input data, using a clock and data recovery circuit that extracts clock and data from the input data; and by using an optimization control circuit, performing a control so that said at least one characteristic is optimized, based on of the operational margin.

17. The method of claim 16, wherein said input/output circuit comprises a SERDES (SERializer and DESerializer) circuit and said pre-emphasis driver circuit and said equalizer circuit comprise interfaces to a transmission line for said SERDES circuit.

18. The method of claim 16, wherein said measuring of operational margin comprises:

comparing an output from a first data sampling circuit receiving said input data with an output from a second data sampling circuit, the output of the second data sampling circuit being shifted in said temporal direction and said voltage direction; and determining an amount of shift in said temporal direction and said voltage direction that causes said comparing to no longer match, said amount of shift thereby comprising the operational margin.

19. The method of claim 16, wherein said optimization control circuit optimizes said at least one characteristic by systematically:

changing a setting of said pre-emphasis driver circuit or said equalizer circuit;

determining an effect of the setting change based on an operational margin due to said setting change; and selecting a setting that provides a marginal operational margin.

20. The method of claim 19, wherein an opposing driver control signal from an opposing input/output circuit is used for optimizing the characteristic of the pre-emphasis driver circuit.

\* \* \* \* \*